(12) United States Patent
Cheng et al.

(10) Patent No.: US 9,735,160 B2
(45) Date of Patent: **\*Aug. 15, 2017**

(54) METHOD OF CO-INTEGRATION OF STRAINED SILICON AND STRAINED GERMANIUM IN SEMICONDUCTOR DEVICES INCLUDING FIN STRUCTURES

(71) Applicant: INTERNATIONAL BUSINESS MACHINES CORPORATION, Armonk, NY (US)

(72) Inventors: Kangguo Cheng, Schenectady, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/146,257

(22) Filed: May 4, 2016

(65) Prior Publication Data

US 2016/0247806 A1 Aug. 25, 2016

Related U.S. Application Data

(63) Continuation of application No. 14/857,182, filed on Sep. 17, 2015, now Pat. No. 9,379,111, which is a
(Continued)

(51) Int. Cl.
*H01L 21/00* (2006.01)
*H01L 27/00* (2006.01)
(Continued)

(52) U.S. Cl.
CPC .... *H01L 27/0924* (2013.01); *H01L 21/02381* (2013.01); *H01L 21/02532* (2013.01);
(Continued)

(58) Field of Classification Search
CPC ......... H01L 21/02381; H01L 21/76224; H01L 21/823821; H01L 21/823814;
(Continued)

(56) References Cited

U.S. PATENT DOCUMENTS 6,815,738 B2 11/2004 Rim
7,247,912 B2 7/2007 Zhu et al.
(Continued)

OTHER PUBLICATIONS

C. Wee et al., "Mobility-enhancement technologies," IEEE Circuits and Devices Magazine, vol. 21, No. 3, 2005, pp. 21-36.
(Continued)

*Primary Examiner* — Nikolay Yushin
(74) *Attorney, Agent, or Firm* — Tutunjian & Bitetto, P.C.; Louis J. Percello

(57) ABSTRACT

A method of forming a semiconductor device that includes forming an at least partially relaxed semiconductor material, and forming a plurality of fin trenches in the partially relaxed semiconductor material. At least a portion of the plurality of fin trenches is filled with a first strained semiconductor material that is formed using epitaxial deposition. A remaining portion of the at least partially relaxed semiconductor material is removed to provide a plurality of fin structure of the first strained semiconductor material.

20 Claims, 10 Drawing Sheets

Related U.S. Application Data continuation of application No. 14/323,126, filed on Jul. 3, 2014, now Pat. No. 9,196,479.

(51) Int. Cl.
*H01L 29/00* (2006.01)
*H01L 27/092* (2006.01)
*H01L 29/78* (2006.01)
*H01L 21/02* (2006.01)
*H01L 21/8238* (2006.01)
*H01L 29/16* (2006.01)
*H01L 29/66* (2006.01)
*H01L 21/308* (2006.01)
*H01L 21/762* (2006.01)
*H01L 29/165* (2006.01)

(52) U.S. Cl.
CPC ...... *H01L 21/308* (2013.01); *H01L 21/76224* (2013.01); *H01L 21/823807* (2013.01); *H01L 21/823814* (2013.01); *H01L 21/823821* (2013.01); *H01L 21/823878* (2013.01); *H01L 27/0922* (2013.01); *H01L 29/16* (2013.01); *H01L 29/165* (2013.01); *H01L 29/66636* (2013.01); *H01L 29/785* (2013.01); *H01L 29/7848* (2013.01); *H01L 21/0262* (2013.01)

(58) Field of Classification Search
CPC ............ H01L 21/308; H01L 21/02532; H01L 27/0924; H01L 27/0922; H01L 27/0928; H01L 29/66636; H01L 29/7848; H01L 29/165
See application file for complete search history.

(56) References Cited

U.S. PATENT DOCUMENTS

| | | |
|---|---|---|
| 7,304,336 B2 | 12/2007 | Cheng et al. |
| 7,622,773 B2 | 11/2009 | Irisawa et al. |
| 7,705,345 B2 | 4/2010 | Bedell et al. |
| 7,842,559 B2 | 11/2010 | Jakschik et al. |
| 8,288,760 B2 | 10/2012 | Tezuka et al. |
| 2012/0319211 A1 | 12/2012 | van Dai et al. |
| 2015/0206965 A1* | 7/2015 | Cheng ................... H01L 29/785 257/190 |

OTHER PUBLICATIONS

I. Ok et al., "Strained SiGe and Si FinFETs for high performance logic with SiGe/Si stack on SOI," IEEE International Electron Devices Meeting, IEDM, 2010, pp. 34.2.1-34.2.4.

* cited by examiner

Table 1: Density, Lattice Parameter, and Chemical Comp. for Si and Ge alloy

| Density | Lattice Parameter | Chemical Comp. |
|---|---|---|
| 2.6382 | ... | 7.5 |
| 2.6319 | ... | 8.0 |
| 2.6357 | ... | 8.0 |
| 2.6330 | 5.4492 | .. |
| 3.0047 | ... | 18.9 |
| 3.0098 | ... | 20.0 |
| 3.0710 | ... | 21.4 |
| 3.0830 | ... | 21.7 |
| 3.0120 | 5.4726 | .. |
| 3.0822 | 5.4772 | .. |
| 3.0884 | ... | 22.6 |
| 3.1118 | ... | 23.5 |
| 3.2723 | ... | 28.2 |
| 3.2844 | 5.4898 | .. |
| 3.3634 | ... | 30.5 |
| 3.3585 | ... | 31.6 |
| 3.4735 | 5.5032 | .. |
| 3.4762 | ... | 35.4 |
| 3.5181 | ... | 35.5 |
| 3.5715 | ... | 36.6 |
| 3.6312 | 5.5151 | .. |
| 3.6313 | ... | 38.8 |
| 3.6340 | ... | 39.8 |
| 3.6874 | ... | 40.3 |
| 3.6766 | ... | 41.4 |
| 3.7750 | 5.5250 | .. |
| 3.7827 | ... | 44.5 |
| 3.7883 | ... | 44.6 |
| 3.9915 | 5.5404 | .. |
| 3.8944 | ... | 48.0 |
| 3.9940 | ... | 49.9 |
| 4.0037 | ... | 50.6 |
| 4.0749 | 5.5475 | .. |
| 4.0673 | ... | 53.8 |
| 4.0897 | ... | 54.8 |
| 4.1652 | ... | 57.0 |
| 4.1923 | 5.5567 | .. |
| 4.5289 | 5.5841 | .. |
| 4.5170 | ... | 68.0 |
| 4.4969 | ... | 68.9 |
| 4.6817 | 5.5966 | .. |
| 4.6652 | ... | 71.9 |
| 4.6735 | ... | 72.3 |
| 4.8246 | ... | 79.4 |
| 4.8513 | ... | 79.4 |
| 4.8410 | 5.6112 | .. |
| 5.0752 | 5.6325 | .. |
| 5.0754 | ... | 87.3 |
| 5.0728 | ... | 87.9 |
| 5.0970 | ... | 88.8 |
| 5.0410 | ... | 89.4 |
| 5.1090 | ... | 90.8 |
| 5.1697 | 5.6419 | .. |
| 5.1669 | ... | 94.8 |
| 5.3256 | 5.6575 | Ge |
| 5.32674 | 5.65754 | Ge |
| 2.3277 | 5.4310 | Si |
| 2.32902 | 5.43072 | Si |

FIG. 2

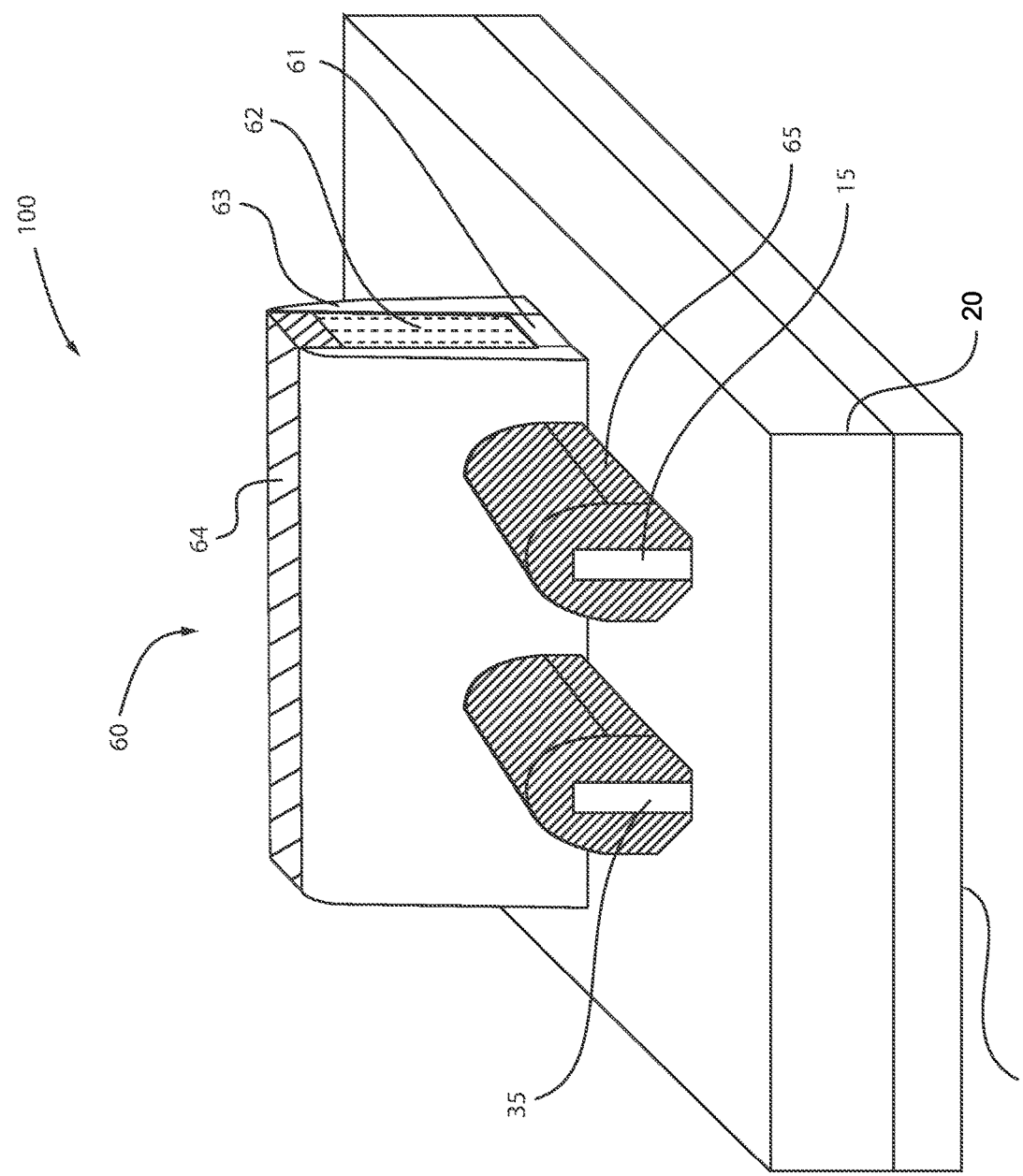

METHOD OF CO-INTEGRATION OF STRAINED SILICON AND STRAINED GERMANIUM IN SEMICONDUCTOR DEVICES INCLUDING FIN STRUCTURES

BACKGROUND

Technical Field

The present disclosure relates to semiconductor devices, such as semiconductor devices including fin structures composed of strained semiconductor materials.

Description of the Related Art

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (finFET).

SUMMARY

In one aspect, a method of forming a semiconductor device is provided that includes forming an at least partially relaxed semiconductor material, and forming a plurality of fin trenches in the partially relaxed semiconductor material. At least a portion of the plurality of fin trenches may then be epitaxially filled with a first strained semiconductor material. A remaining portion of the at least partially relaxed semiconductor material is then removed to provide a plurality of fin structure of the first strained semiconductor material.

In another embodiment, the method of forming the semiconductor device may include forming an at least partially relaxed semiconductor material, and forming a plurality of fin trenches in the partially relaxed semiconductor material. A first strained semiconductor material may be epitaxially formed in a first portion of fin trenches, and a second strained semiconductor material may be epitaxially formed in a second portion of the fin trenches. A remaining portion of the at least partially relaxed semiconductor material is then removed to provide a first plurality of fin structures of the first strained semiconductor material and a second plurality of fin structures of the second strained semiconductor material.

In another aspect, an electrical device is provided that includes a partially relaxed substrate, a first plurality of FinFETs on a first portion of the partially relaxed substrate, and a second plurality of FinFETs on a second portion of the partially relaxed substrate. The first plurality of FinFETs includes first fin structures of a first base material that is unalloyed strained silicon, and first source and drain regions of a first conductivity type. The second plurality of FinFETs includes second fin structures of a second base material that is unalloyed strained germanium, and second source and drain region of a second conductivity type.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which:

FIG. 2 is a table of the lattice constant of silicon germanium with increasing germanium content.

FIG. 13 is a perspective view depicting one embodiment of Fin Field Effect Transistors (FinFETs) formed from the fin structures of the first strained semiconductor material and the second strained semiconductor material that are depicted in FIG. 12.

DETAILED DESCRIPTION

Figure 1:
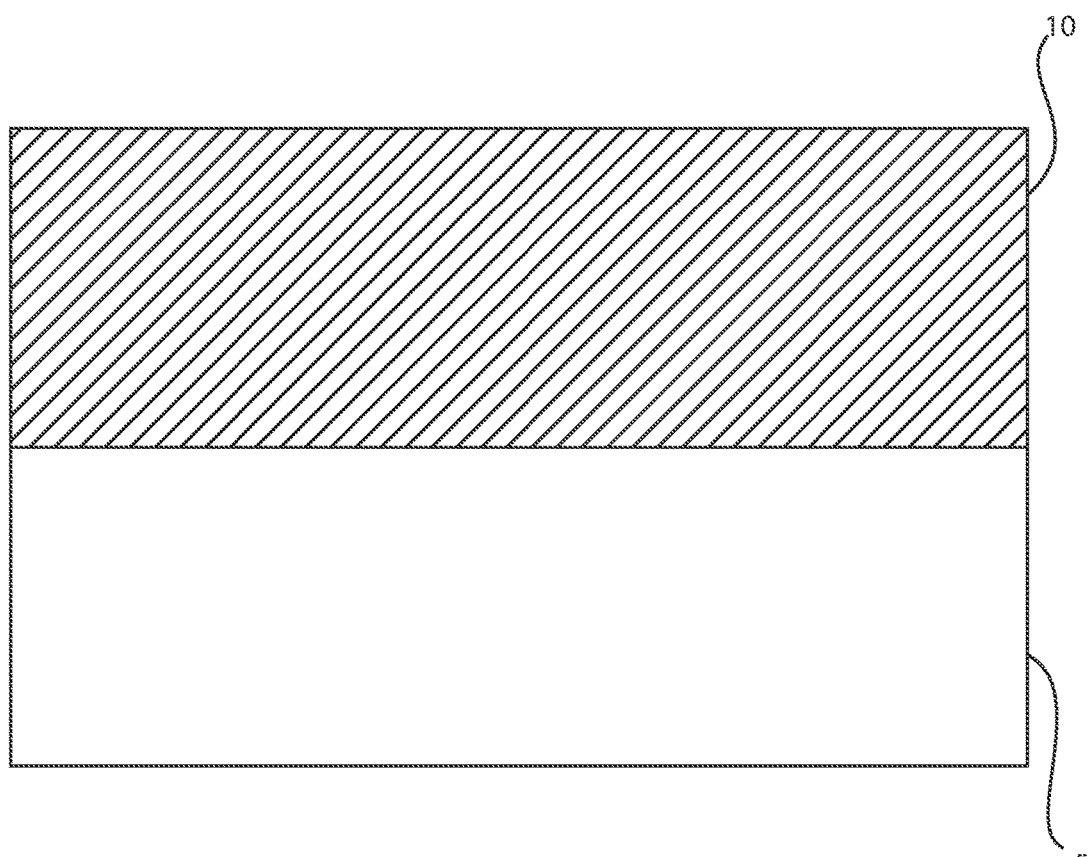
FIG. 1 is a side cross-sectional view depicting one embodiment of forming an at least partially relaxed semiconductor material on a substrate, in accordance with the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on", and "over" mean that a first element, such as a first structure, is present on a second element, such as a second structure, wherein intervening elements, such as an interface structure, e.g. interface layer, may be present between the first element and the second element. The terms "direct contact" and "contacting" mean that a first element, such as a first structure, and a second element, such as a second structure, are connected without any intermediary conducting, insulating or semiconductor layers at the interface of the two elements. As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. A Fin Field Effect Transistor (FinFET) is a semiconductor device that positions the channel region of the semiconductor device in a fin structure.

In some embodiments, the methods and structures disclosed herein provide a FinFET semiconductor device having strained based performance enhancements. One way to strain the channel region of the FinFET is by growing strain inducing epitaxial material, in which the epitaxial material being grown has different lattice dimensions than the deposition surface that the epitaxial material is formed on. For example, germanium (Ge) that is epitaxially grown on a silicon germanium (SiGe) deposition surface produces a compressive stress that when induced on the channel region of a p-type conductivity FinFET increases hole carrier mobility, and silicon (Si) that is epitaxially grown on a silicon germanium (SiGe) deposition surface produces a tensile stress that when induced on the channel region of an n-type conductivity FinFET increases electron carrier mobility. The term "epitaxial material" denotes a semiconductor material that has been formed using an epitaxial growth and/or epitaxial deposition process. "Epitaxial growth and/or epitaxial deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled, and the system parameters set correctly, the depositing atoms of an epitaxial deposition process arrive at the deposition surface with sufficient energy to move around on the surface and orient themselves to the crystal arrangement of the atoms of the deposition surface. An epitaxial material has substantially the same crystalline characteristics as the semiconductor material of the deposition surface. For example, an epitaxial film deposited on a {100} crystal surface will take on a {100} orientation. The epitaxial deposition process may be carried out in the deposition chamber of a chemical vapor deposition (CVD) apparatus.

The FinFET is one example of an architecture used in advanced integrated circuit fabs. Uniaxial compressively strained germanium (Ge) for p-type field effect transistors, such as FinFETs, and uniaxial tensile strained silicon (Si) for n-type field effect transistors, such as FinFETs, are silicon friendly and reasonable channel materials to start with to increase fin performance in FinFET semiconductor devices. The methods and structures disclosed herein provide strained silicon (Si) fins adjacent to strained germanium (Ge) fins in a side by side arrangement for the production of FinFET semiconductor devices with aggressively scaled fin pitches that can be required for logic applications. The methods and structures of the present disclosure are now discussed with more detail referring to FIGS. 1-13.

FIG. 1 depicts one embodiment of forming an at least partially relaxed semiconductor material 10 on a substrate 5. As used herein, the term "partially relaxed" as used to describe a semiconductor material means a material that is epitaxially formed on a deposition surface, wherein the lattice constant of the semiconductor material that is epitaxially formed is not the same as the lattice dimension of the deposition surface. In some embodiments, the partially relaxed material has a composition that is selected to be as relaxed as possible, i.e., close to the lattice constant of 50% atom % SiGe (one atom Si for one atom Ge). In some embodiments, it is preferred that the partially relaxed material is 50% SiGe, so you have 2.1% strain in the Si and 2.1% strain in the Ge. Overall, the lattice mismatch from Si to Ge is 4%. If only partly relaxed, then the strain in the Si will be lower and the strain in the Ge higher. In some embodiments, the composition and processing of the partially relaxed semiconductor material is set to a target of at least 90% relaxation, in either direction, i.e., a compressive strain direction or mean tensile strain direction in the 50% SiGe. For example, when the substrate 5 is composed of silicon, the lattice constant of the substrate 5 is equal to approximately 5.431 Å. Germanium has a lattice constant of 5.658 Å. Silicon germanium has a lattice constant that varies depending upon its' germanium content, as illustrated in the table included in FIG. 2. A semiconductor material layer of 50% silicon germanium (SiGe) that is formed on a substrate of silicon (Si), i.e., 100 at. % silicon (Si) with a lattice constant of 5.431 Å, is 100% relaxed when the lattice constant of the silicon germanium (SiGe) is approximately 5.545 Å, which is between the lattice constant of germanium (Ge) and the lattice constant of silicon (Si). To provide a relaxed lattice constant of approximately 5.545 Å, the germanium (Ge) content of the silicon germanium layer (SiGe) may be about 50 at. %. See Table 1 in FIG. 2. It is noted that a 50% SiGe material, which is at least 90% relaxed, e.g., ranging from 98%-100% relaxed, silicon germanium layer is only one composition that is suitable for the at least partially relaxed semiconductor material 10. In some examples, the at least partially relaxed semiconductor material 10 may be any silicon and germanium composition, such as the silicon germanium compositions that are listed in the table included in FIG. 2. For example, the at least partially relaxed semiconductor substrate 10 may have a germanium content ranging from 30 at. % to 70 at. %.

The substrate 5 that the at least partially relaxed semiconductor material 10 is formed on may be a semiconductor substrate. The semiconductor substrate may have a single crystal, i.e., monocrystalline, crystal structure. In some embodiments, the semiconductor substrate 100 is composed of a silicon including material. In some embodiments, the silicon including material that provides the semiconductor substrate may include, but is not limited to silicon, single crystal silicon, strained silicon, silicon doped with carbon (Si:C), silicon alloys or any combination thereof. Although, the semiconductor substrate that is depicted in FIG. 1 is a bulk semiconductor substrate, the present disclosure is not limited to only this embodiment. For example, the semiconductor substrate may also be a semiconductor on insulator (SOI) substrate. In some examples, when the semiconductor substrate is an SOI substrate, the SOI substrate may include a base semiconductor substrate, a buried insulating layer that is present on the base semiconductor substrate, and a semiconductor on insulator (SOI) layer that is present on the buried insulator layer. In some embodiments, the SOI layer may be composed of a silicon including material that is similar to the above description of the silicon material for the bulk semiconductor substrate. The buried insulating layer may be an oxide, such as silicon oxide. The base semiconductor substrate may be a semiconducting material that may include, but is not limited to, silicon (Si), germanium (Ge), silicon germanium (SiGe), silicon germanium doped with carbon (SiGe:C), germanium alloys, GaAs, InAs, InP as well as other III/V and II/VI compound semiconductors.

In one embodiment, the at least partially relaxed semiconductor material 10 may be formed using a condensation method. This technique is based on the total miscibility of germanium (Ge) and silicon (Si) (same crystalline structure) and on the difference of chemical affinities between germanium (Ge) and silicon (Si) with respect to oxygen (O). In some embodiments, when forming the at least partially relaxed semiconductor material 10 using condensation methods, the at least partially relaxed semiconductor material 10 is formed using an SOI substrate. More specifically, a condensation method can provide for relaxed and thin SiGe layers on buried insulating layers (e.g., buried oxide (BOX)), i.e., SiGe on insulator (SGOI). This fabrication technique can be based on the high-temperature oxidation of the SGOI layers with a lower germanium (Ge) fraction. It is found that germanium (Ge) atoms are rejected from the oxide and condensed in the SGOI layers. The conservation of the total amount of germanium (Ge) atoms in the SGOI layer is confirmed by structural and compositional analyses of dry-oxidized SGOI layers at a temperature ranging from 850° C. to 1250° C., e.g., 1050° C., depending on the starting SiGe %. The higher the final SiGe %, the lower the temperature has to get to avoid melting, but it can be desirable to set the final SiGe % as high as possible to maintain Si and Ge diffusion and classical tradeoff of different initial thicknesses and oxidation times.

In one embodiment, the condensation method for forming the at least partially relaxed semiconductor material 10 may begin with epitaxial growth of a germanium (Ge) containing material, such as silicon germanium (SiGe), on the silicon surface of the substrate 5, e.g., on the SOI layer that is present on the buried insulating layer (not shown) of the SOI substrate. The epitaxial growth may be performed by chemical vapor deposition or molecular beam epitaxy. In one example, the epitaxial growth is performed by rapid thermal chemical vapor deposition (RTCVD). Following formation of the germanium containing material, the germanium containing material, e.g., silicon germanium (SiGe) material, is oxidized to form an oxide layer. For example, the germanium containing material may be subjected to a dry or wet oxidation process, typically at a temperature greater than 850° C. As the deposited silicon germanium (SiGe) material layer oxidizes, germanium (Ge) atoms are rejected by the oxide layer that is being formed on the silicon germanium (SiGe) and/or the buried insulating layer, e.g., buried oxide layer. It will be appreciated by those skilled in the art that this process of displacing and/or condensing germanium (Ge) from the silicon germanium (SiGe) layer provides a germanium (Ge) rich layer, which provides the at least partially relaxed semiconductor material 10. The oxide layer that is formed on the upper layer of the silicon germanium (SiGe) layer by thermal oxidation may be selectively removed, such as by etching, for example, using a dilute hydrofluoric acid (HF).

Following removal of the oxide layer, the at least partially relaxed semiconductor material 10 may have a thickness ranging from 10 nm to 1 microns. In another embodiment, the at least partially relaxed semiconductor material 10 may have a thickness ranging from 20 nm to 500 nm. In yet another embodiment, the at least partially relaxed semiconductor material 10 may have a thickness ranging from 25 nm to 100 nm. It is noted that the above ranges for the thickness of the partially relaxed semiconductor material 10 is provided for illustrative purposes only, and is not intended to limit the present disclosure. For example, the thickness of the at least partially relaxed semiconductor material dictates the height of the later formed fin structures. Therefore, any height for a fin structure may be suitable for a thickness of the at least partially relaxed semiconductor material 10.

In another embodiment, the at least partially relaxed semiconductor material 10 that is formed on the substrate 5 may be formed using by epitaxially depositing a plurality of silicon (Si) and germanium (Ge) layers having a graded and increasing germanium (Ge) content. More specifically, when the substrate 5 is composed of 100 at. % silicon (Si), the first epitaxial layer of silicon germanium (SiGe) may be a buffer layer having about 5 at. % germanium (Ge). Thereafter, a second epitaxial layer of silicon germanium (SiGe) may be formed on the buffer layer, wherein the second epitaxial layer of silicon germanium (SiGe) has a greater germanium (Ge) content than the buffer layer, e.g., the second epitaxial layer has a germanium (Ge) content of 10 at. %. In a following sequence, a third epitaxial formed silicon germanium (SiGe) layer having approximately 15 at. % germanium (Ge), a fourth epitaxial formed silicon germanium (SiGe) layer having approximately 20 at. % germanium (Ge), and a fifth epitaxial formed silicon germanium (SiGe) layer having approximately 25 at. % germanium (Ge) is deposited. The number of layers being deposited, the thickness of the layers being deposited, and the composition of the material layers being deposited may be selected to provide a semiconductor material that is at least partially relaxed. For example, the average composition for the epitaxially deposited plurality of silicon (Si) and germanium (Ge) layers having a graded and increasing germanium content may provide a material stack that is at least 50% relaxed, e.g., has an average germanium (Ge) content on the order of approximately 50 at. %. In some embodiments, a thermal anneal step may be employed to facilitate relaxation of the plurality of silicon (Si) and germanium (Ge) layers having a graded and increasing germanium content to provide the at least partially relaxed semiconductor material 10.

The thickness for each layer in the plurality of silicon and germanium layers having a graded and increasing germanium content that provides the at least partially relaxed semiconductor material 10 may be several microns. One example of thicknesses and compositions that can provide the at least partially relaxed semiconductor material 10 using graded compositions may include layers having a thickness ranging from 500 nm to 3000 nm with increasing germanium content in 5% steps until 50% SiGe is reached. For example, a first layer may include 500 nm to 3000 nm of 5% SiGe, followed by 500 nm to 3000 nm of 10% SiGe, and so on in 5% step integrals until 50% SiGe is formed. Typically, once 50% SiGe is reached, another 1 micron to 5 microns of 50% SiGe may be formed, i.e., grown, to fully relax the material to the lattice constant of perfect 50% SiGe or substantially close to the lattice constant of perfect SiGe. The at least partially relaxed semiconductor material 10 formed by epitaxially depositing a plurality of silicon (Si) and germanium (Ge) layers having a graded and increasing germanium (Ge) content is typically greater than the thickness of the at least partially relaxed semiconductor material 10 that is formed using condensation methods.

In yet another embodiment, the SGOI substrate including the at least partially relaxed semiconductor material 10 is formed using wafer bonding methods and smart cut methods. Smart Cut™ methods employ transferring a portion of a wafer from a source wafer to a supporting wafer by a sequence that can begin with implanting a source wafer with a dopant, such as hydrogen, to form a damaged interface. The dopant for forming the damaged interface may be hydrogen. In some examples, prior to forming the damaged interface a surface of the source wafer can be oxidized. Following formation of the damaged interface, a support wafer may be bonded to the source wafer, e.g., bonded to the oxidized surface of the source wafer. The source wafer can then be cleaved along the damaged interface separating a portion of the source wafer from an assembly of a remaining portion of the source wafer that is bonded to the supporting wafer, typically through the oxidized surface. In the embodiments, in which the dopant source for forming the damaged interface is hydrogen, separation along the damaged surface can be caused by converting the hydrogen dopant into hydrogen gas bubbles, which can be achieved through increased temperature. In some embodiments, the surface of the remaining portion of the source wafer may be planarized, e.g., planarized by chemical mechanical planarization (CMP). In some embodiments, the remaining portion of the source substrate may provide an at least partially relaxed semiconductor material 10 that is in direct contact with a dielectric layer, such as the above described oxidized surface. Further details regarding the Smart Cut™ process are provided in U.S. Pat. No. 5,374,564, Bruel, Michel, "Process for the production of thin semiconductor material films", published 20 Dec. 1994, which is incorporated herein, in its entirety.

Figure 3A:
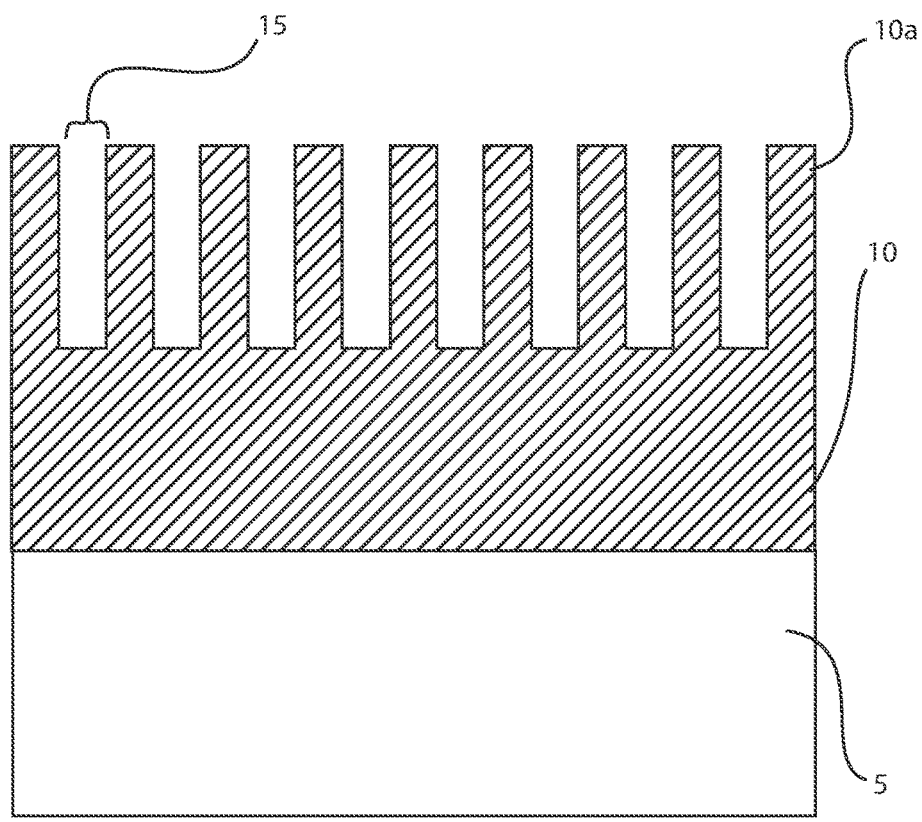
FIG. 3A is a side cross-sectional view depicting forming a plurality of fin trenches in the partially relaxed semiconductor material, in accordance with one embodiment of the present disclosure.
Figure 3B:
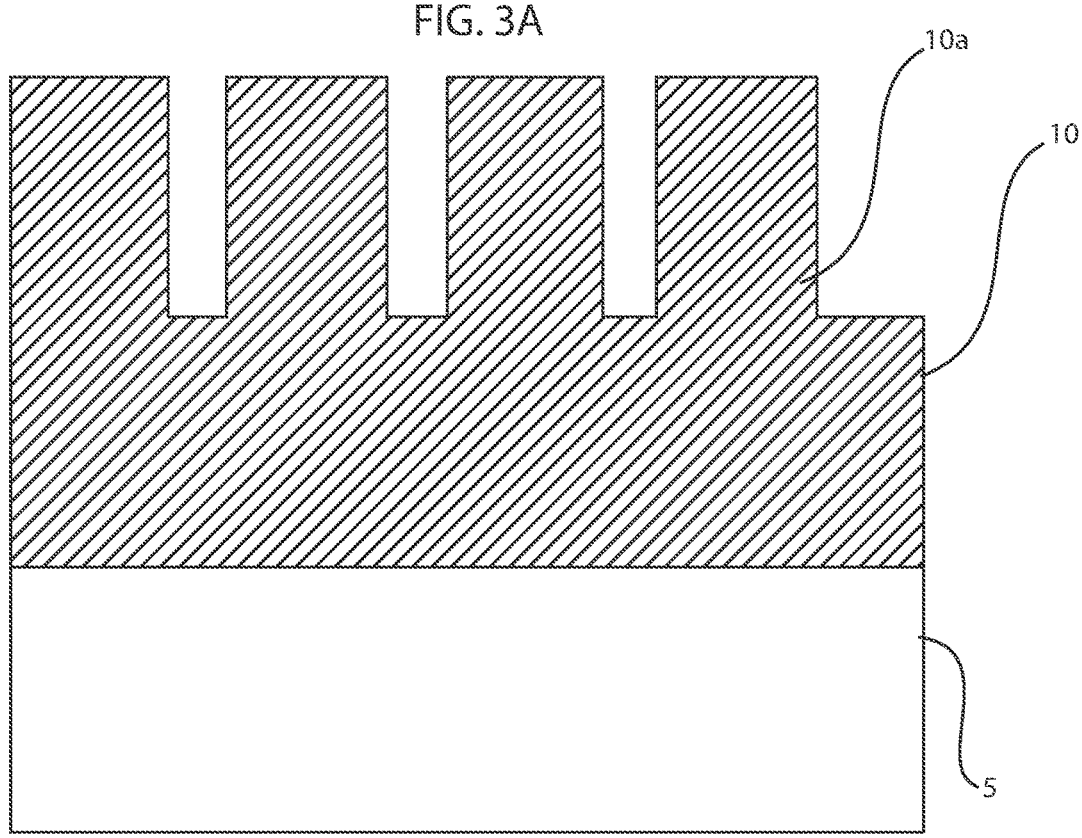
FIG. 3B is a side cross-sectional view depicting another embodiment of forming a plurality of fin trenches in the partially relaxed semiconductor material, wherein the pitch is increased between the later formed adjacent fin structures, and the width of the fin structures is decreased, in comparison to the embodiment in which the fin trenches are formed in accordance with FIG. 3A.

FIGS. 3A and 3B depict one embodiment of forming a plurality of fin trenches 15 in the partially relaxed semiconductor material 10. The fin trenches 15 may be formed using photolithography and etching processes, which may include a modified sidewall image transfer (SIT) method, which may be referred to as a reverse sidewall image transfer (SIT). In one example of an SIT method, a photoresist mandrel is first formed on a surface of the at least partially relaxed semiconductor material 10 of the substrate that is processed to provide the fin trenches 15. The photoresist mandrel may be formed using deposition, patterning and development processes. Thereafter, a low-pressure chemical vapor (isotropic) deposition provides a dielectric profile on the sidewalls of the photoresist mandrel. The photoresist mandrel may then be removed. For example, the photoresist mandrel can be removed using a chemical strip or selective etching. Following removal of the photoresist mandrel, the dielectric profile remains to provide an etch mask. The at least partially relaxed semiconductor material 10 is then etched using the dielectric profile as an etch mask to provide the fin trenches 15. The etch process for forming the fin trenches 15 may be an anisotropic etch. An "anisotropic etch process" denotes a material removal process in which the etch rate in the direction normal to the surface to be etched is greater than in the direction parallel to the surface to be etched. One form of anisotropic etching that is suitable for forming the fin trenches 15 is reactive ion etching. Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present disclosure include ion beam etching, plasma etching or laser ablation. Because the SIT process is employed to form fin trenches 15 instead of fin structures, wherien the fin trenches 15 define the later formed fin structures, the SIT process may be referred to as a "reverse SIT process".

The fin trenches 15 dictate the width and pitch of the later formed fin structures. In some embodiments, the fin pitch is at least twice the width of the subsequently formed fin structures, which are formed within the fin trenches 15. The pitch is the distance from the center of a first fin to the center of a second fin that is separating adjacent fin structures. The pitch is typically a repeating dimension amongst a plurality of adjacent fin structures. For example, when the fin pitch is 20 nm to 50 nm, the width of the fins is 6 nm to 10 nm. In other embodiments, the fin pitch may range from 10 nm to 100 nm. In another embodiment, the fin pitch may range from 15 nm to 50 nm. The fin width of the later formed fin structures is dictated by a width of the fin trenches 15. In one embodiment the width of the fin trenches 15, and the later formed fin structures, ranges from 2 nm to 20 nm. In another embodiment the width of the fin trenches 15, and the later formed fin structures, ranges from 4 nm to 12 nm.

FIG. 3A depicts one embodiment of fin trenches 15 that are formed to provide a fin pitch that is twice the width of the fin structures that are formed in the fin trenches 15. FIG. 3B depicts another embodiment of forming a plurality of fin trenches 15 in the partially relaxed semiconductor material 10, wherein the spacing between adjacent fin trenches 15 and the width of the fin trenches 15 is selected to provide an increased fin pitch, and decreased fin width, for the fin structures that are subsequently formed in the fin trenches 15 when compared to the embodiment of the fin trenches 15 that is depicted in FIG. 3A.

Figure 4:
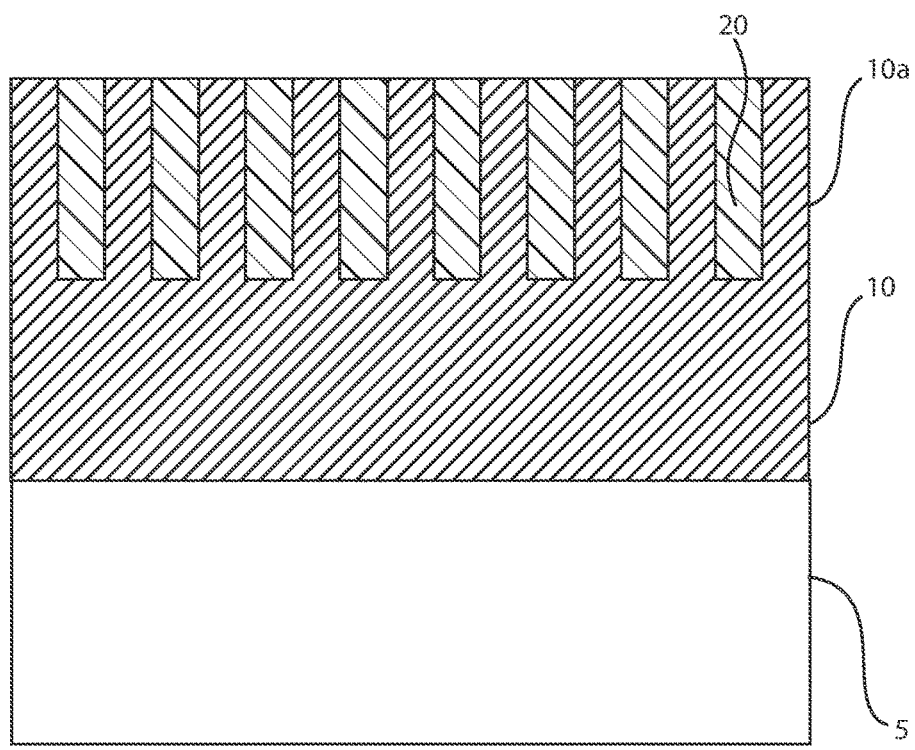
FIG. 4 is a side cross-sectional view depicting epitaxially forming a first strained semiconductor material in a first portion of fin trenches, in accordance with one embodiment of the present disclosure.

FIG. 4 depicts one embodiment of epitaxially forming a first strained semiconductor material 20 in the fin trenches 15. The term "strained" as used to describe the first strained semiconductor layer, and the subsequently described second strained semiconductor layer, means the presence of a strain, either compressive or tensile, which is developed during preparation of a structure, and can therefore be retained in the structure without external force, in contrast to an extrinsic stress that is applied to a structure by an external force and can only be maintained by maintaining the external force. For example, when a semiconductor material, such as germanium (Ge), has a larger natural lattice dimension than the deposition surface on which it is formed, such as silicon germanium (SiGe), and the material is epitaxially formed so that it is formed with the lattice dimension of the deposition surface, which is less than the material's natural lattice dimension, than the material being epitaxially formed will have an intrinsic strain, i.e., intrinsic compressive strain. In another example, when a semiconductor material, such as silicon (Si), has a smaller natural lattice dimension, than the deposition surface on which it is formed, such as silicon germanium (SiGe), and the material is epitaxially formed so that it is formed with the lattice dimension of the deposition surface, which is more than the material's natural lattice dimension, than the material being formed will have an intrinsic strain, i.e., an intrinsic tensile strain.

In the embodiment that is depicted in FIG. 4, the first strained semiconductor material 20 that is being formed in the fin trenches 15 is germanium (Ge). The first strained semiconductor material 20 typically has an intrinsic compressive strain. The germanium (Ge) that is formed in the fin trenches 15 is unalloyed. By "unalloyed" it is meant that when the semiconductor material that provides the first strained semiconductor material is germanium (Ge), the semiconductor material that provides the first strained semiconductor material 20 is 100 at. % germanium. The term "unalloyed" denotes the base composition for the first strained semiconductor material, which allows for the first strained semiconductor material 20 to further include n-type or p-type dopants.

The first strained semiconductor material 20 is formed using an epitaxial deposition process. When the first strained semiconductor material 20 is composed of germanium (Ge), the germanium (Ge) gas source for epitaxial deposition may be selected from the group consisting of germane ($GeH_4$), digermane ($Ge_2H_6$), halogermane, dichlorogermane, trichlorogermane, tetrachlorogermane and combinations thereof.

In some embodiments, the deposition process for forming the first strained semiconductor material 20 overfills the fin trenches 15. In this instance, a planarization process, such as chemical mechanical planarization (CMP), can be applied to the upper surface of the first strained semiconductor material 20 so that the upper surface of the first strained semiconductor material 20 is coplanar with a remaining portion of the at least partially relaxed semiconductor material 10a.

Figure 5:
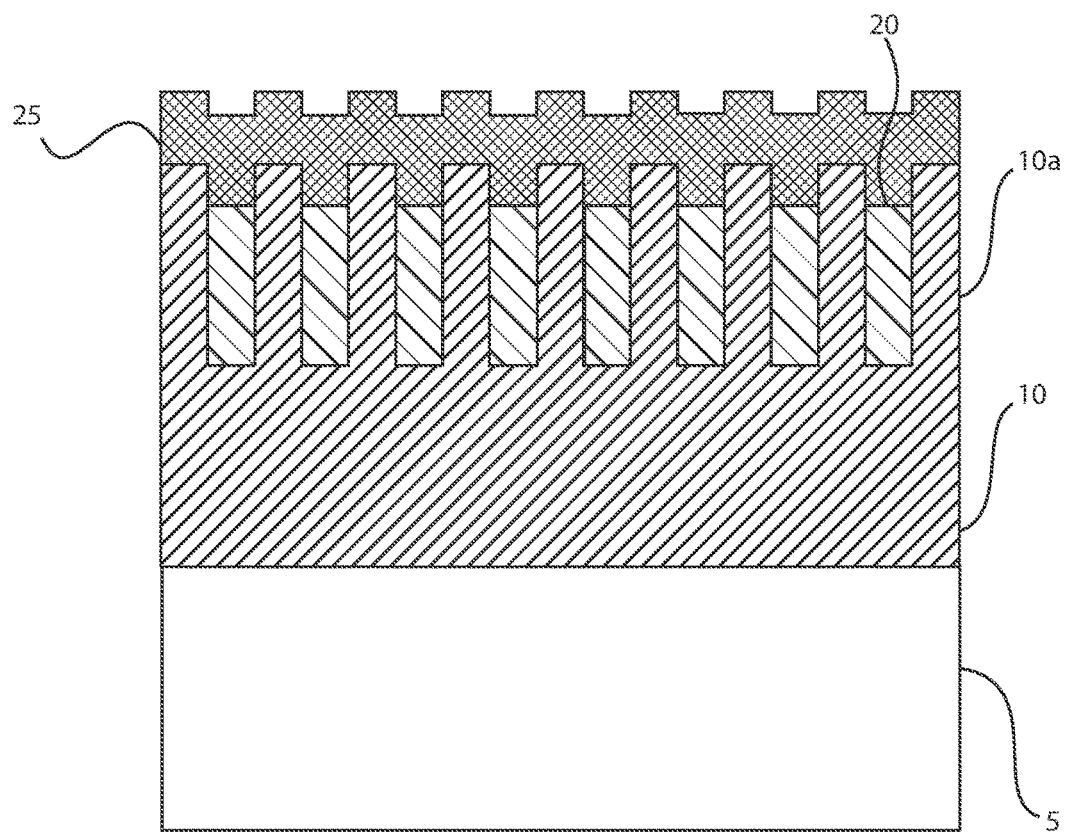
FIG. 5 is a side cross-sectional view depicting recessing an upper surface of the first strained semiconductor material relative to an upper surface of the remaining portion of the at least partially relaxed semiconductor material and blanket depositing a dielectric layer for a dielectric fin cap, in accordance with one embodiment of the present disclosure.

FIG. 5 depicts one embodiment of recessing an upper surface of the first strained semiconductor material 20 relative to an upper surface of the remaining portion of the at least partially relaxed semiconductor material 10a that provides the sidewalls of the fin trenches, and forming a blanket dielectric layer 25 for the dielectric fin cap to the first strained semiconductor material 20. The upper surface of the first strained semiconductor material 20 may be recessed with a etch that is selective to the remaining portion of the at least partially relaxed semiconductor material 10a. The term "selective" as used to describe a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 100:1 or greater. The etch process for recessing the first strained semiconductor material 20 may be an anisotropic etch or an isotropic etch. In one embodiment, the etch for recessing the first strained semiconductor material 20 may be a wet chemical etch. In another embodiment, the etch for recessing the first strained semiconductor material 20 may be reactive ion etch (RIE). The amount that the first strained semiconductor material 20 is recessed is the amount that is suitable for forming the dielectric fin cap.

Figure 6:
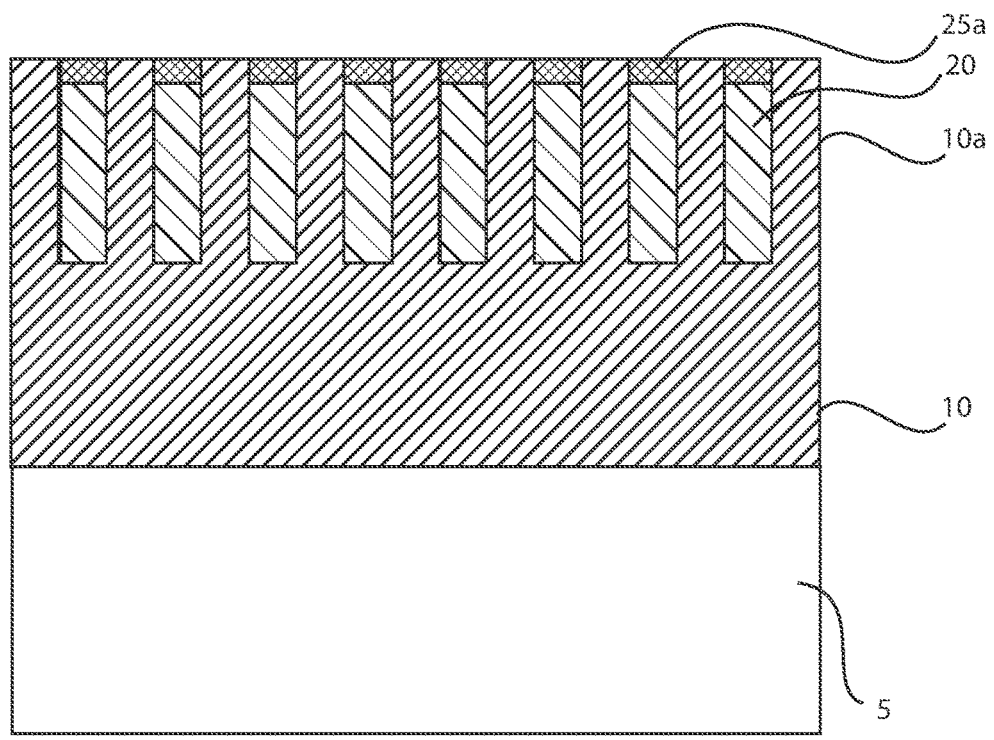
FIG. 6 is a side cross-sectional view depicting planarizing the blanket dielectric layer, wherein a remaining portion of the blanket dielectric layer provides a dielectric fin cap present atop the first strained semiconductor material, in accordance with one embodiment of the present disclosure.

The blanket dielectric layer 25 that is deposited atop the recessed surface of the first strained semiconductor material 10 provides the dielectric fin cap 25a. The blanket dielectric layer 25 may be composed of a dielectric material, such as an oxide, nitride, oxynitride, high-k dielectric, low-k dielectric, or any suitable combination of those materials. For example, when the blanket dielectric layer 25 is an oxide, the blanket dielectric layer 25 may be composed of silicon oxide. In another example, when the blanket dielectric layer 25 is a nitride, the blanket dielectric layer 25 may be composed of silicon nitride. The blanket dielectric layer 25 may be deposited using a chemical vapor deposition (CVD) process, such as plasma enhanced chemical vapor deposition (PECVD), metal organic chemical vapor deposition (MOCVD), high density plasma chemical vapor deposition (HDPCVD) or a combination thereof. The blanket dielectric layer 25 may also be formed using a thermal growth method, such as thermal oxidation. Following deposition, the blanket dielectric layer 25 may be planarized so that an upper surface of the remaining portion of the blanket dielectric layer 25 may be coplanar with a remaining portion of the at least partially relaxed semiconductor material 10a that provides the sidewalls of the fin trenches, wherein the remaining portion of the blanket dielectric layer 25 provides the dielectric fin cap 25a for the fin structures formed from the first strained semiconductor material 10, as depicted in FIG. 6.

Figure 7:
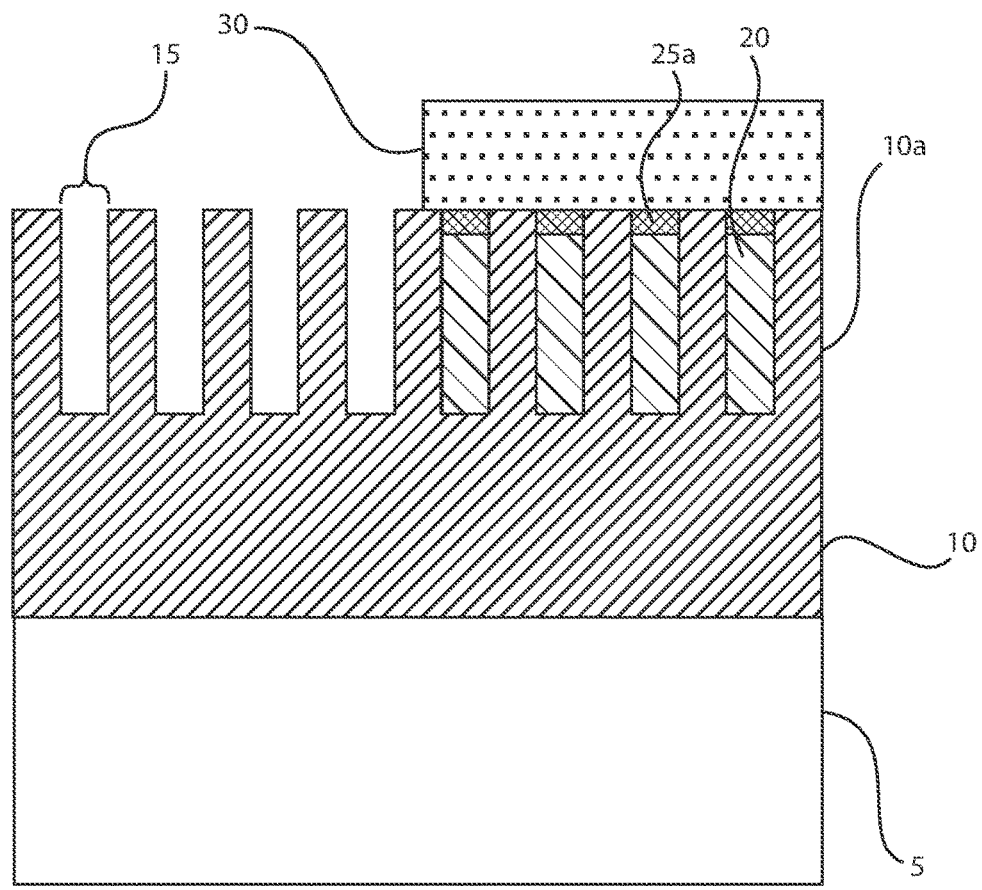
FIG. 7 is a side cross-sectional view depicting forming an etch mask over a first plurality of fin trenches containing the first strained semiconductor material, and removing the dielectric fin cap and the first strained semiconductor material from the exposed fin trenches, in accordance with one embodiment of the present disclosure.

FIG. 7 depicts forming an etch mask 30 over a first plurality of fin trenches containing the first strained semiconductor material 20, and removing the dielectric fin cap and a first portion of the first strained semiconductor material from the exposed fin trenches. A second portion of the first strained semiconductor material 20 is protected from being removed by the etch mask 30, while the first portion of the first strained semiconductor material is removed from the exposed fin trenches.

The etch mask 30 is typically formed overlying the portion of the fin trenches 15, in which the first strained semiconductor material 10 is to remain to provide the fin structures for p-type Fin Field Effect Transistors (p-type FinFETs). The etch mask 30 may comprise soft and/or hardmask materials, and can be formed using deposition, photolithography and etching. In one embodiment, the etch mask 30 comprises a photoresist. A photoresist etch mask can be produced by applying a photoresist layer, exposing the photoresist layer to a pattern of radiation, and then developing the pattern into the photoresist layer utilizing conventional resist developer. Typically, the etch mask 30 may have a thickness ranging from 100 nm to 300 nm.

Following formation of the etch mask 30, the fin dielectric caps 25a and the first strained semiconductor material 20 that is present in the exposed fin structures may be removed by an etch that is selective to at least the etch mask 30. In some embodiments, the etch process for removing the first strained semiconductor material 20 is also selective to the partially relaxed semiconductor material 10, 10a. The etch process for removing the fin dielectric caps 25a and the first strained semiconductor material 20 that are present within the exposed fin trenches 15 may be an anisotropic etch or an isotropic etch. In some examples, the etch process for removing the fin dielectric caps 25a and the first strained semiconductor material 20 that are present within the exposed fin trenches 15 may be a wet chemical etch. In other examples, the etch process for removing the fin dielectric caps 25a, and the first strained semiconductor material 20 that are present within the exposed fin trenches 15 may be a dry etch process, such as reactive ion etching (RIE).

Figure 8:
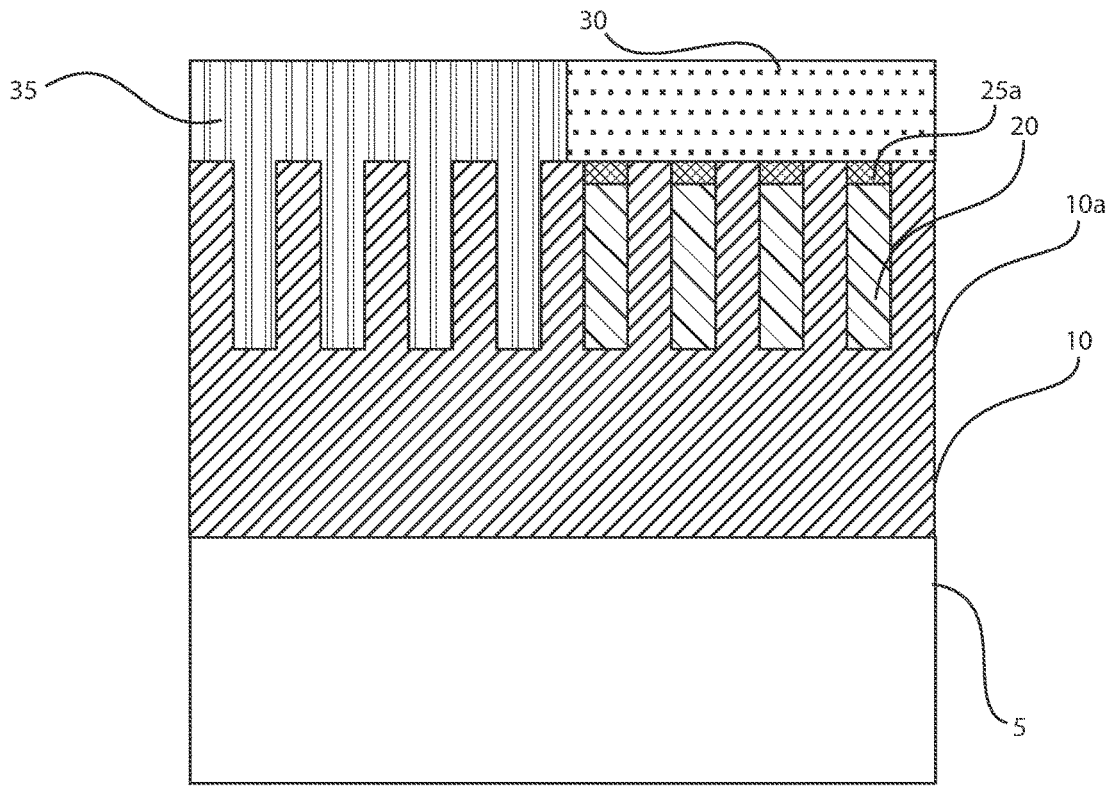
FIG. 8 is a side cross-sectional view depicting forming a second strained semiconductor material in the exposed fin trenches from which the first strained semiconductor material was removed, in accordance with one embodiment of the present disclosure.
Figure 9:
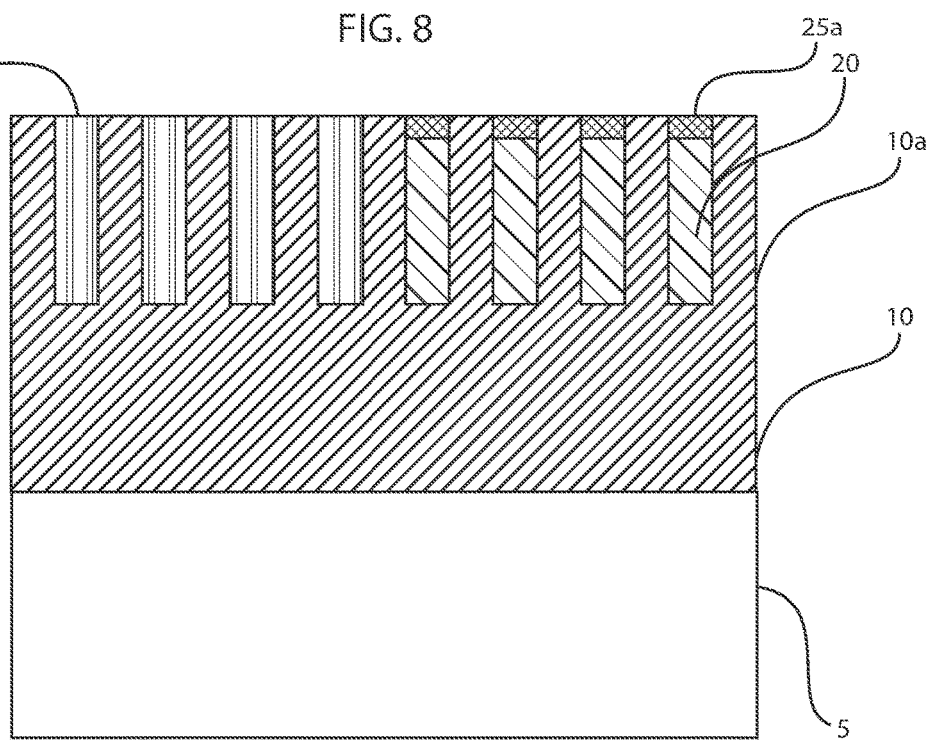
FIG. 9 is a side cross-sectional view depicting planarizing the second strained semiconductor material so that the upper surface of the second strained semiconductor material is coplanar with the upper surface of the remaining portion of the at least partially relaxed semiconductor material, in accordance with one embodiment of the present disclosure.

FIG. 8 depicts one embodiment of forming a second strained semiconductor material 35 in the exposed fin trenches 15 from which the first strained semiconductor material was removed. The term "strained" as used to describe the second strained semiconductor material 35 means the presence of a strain, either compressive or tensile, which is developed during preparation of a structure, and can therefore be retained in the structure without external force, in contrast to an extrinsic stress that is applied to a structure by an external force and can only be maintained by the external force. For example, when a semiconductor material, such as silicon (Si), has a smaller natural lattice dimension, than the deposition surface on which it is formed, such as silicon germanium (SiGe), and the material is epitaxially formed so that it is formed with the lattice dimension of the deposition surface, which is more than the material's natural lattice dimension, than the material being formed will have intrinsic strain, i.e., intrinsic tensile strain.

The second strained semiconductor material 35 is formed using an epitaxial deposition process. Epitaxial deposition processes may be selective deposition processes. For example, although epitaxial material that is deposited using epitaxial deposition orientates to the crystal structure of a semiconductor material, such as the at least partially relaxed semiconductor material 10, 10a, the epitaxial material will not be formed on a dielectric surface, such as the etch mask 30. When the second strained semiconductor material 35 is composed of silicon, the silicon gas source for epitaxial deposition may be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof.

In the embodiment that is depicted in FIG. 8, the second strained semiconductor material 35 that is being formed in the fin trenches 15 is silicon (Si). The second strained semiconductor material 35 typically has an intrinsic tensile strain. The silicon (Si) that is formed in the fin trenches 15 is unalloyed. By "unalloyed" it is meant that when the semiconductor material that provides the second strained semiconductor material 35 is silicon, the semiconductor material that provides the second strained semiconductor material 35 is 100 at. % silicon (Si). The term "unalloyed" denotes the base composition for the second strained semiconductor material 35, which allows for the second strained semiconductor material 35 to further include n-type or p-type dopants.

Figure 10:
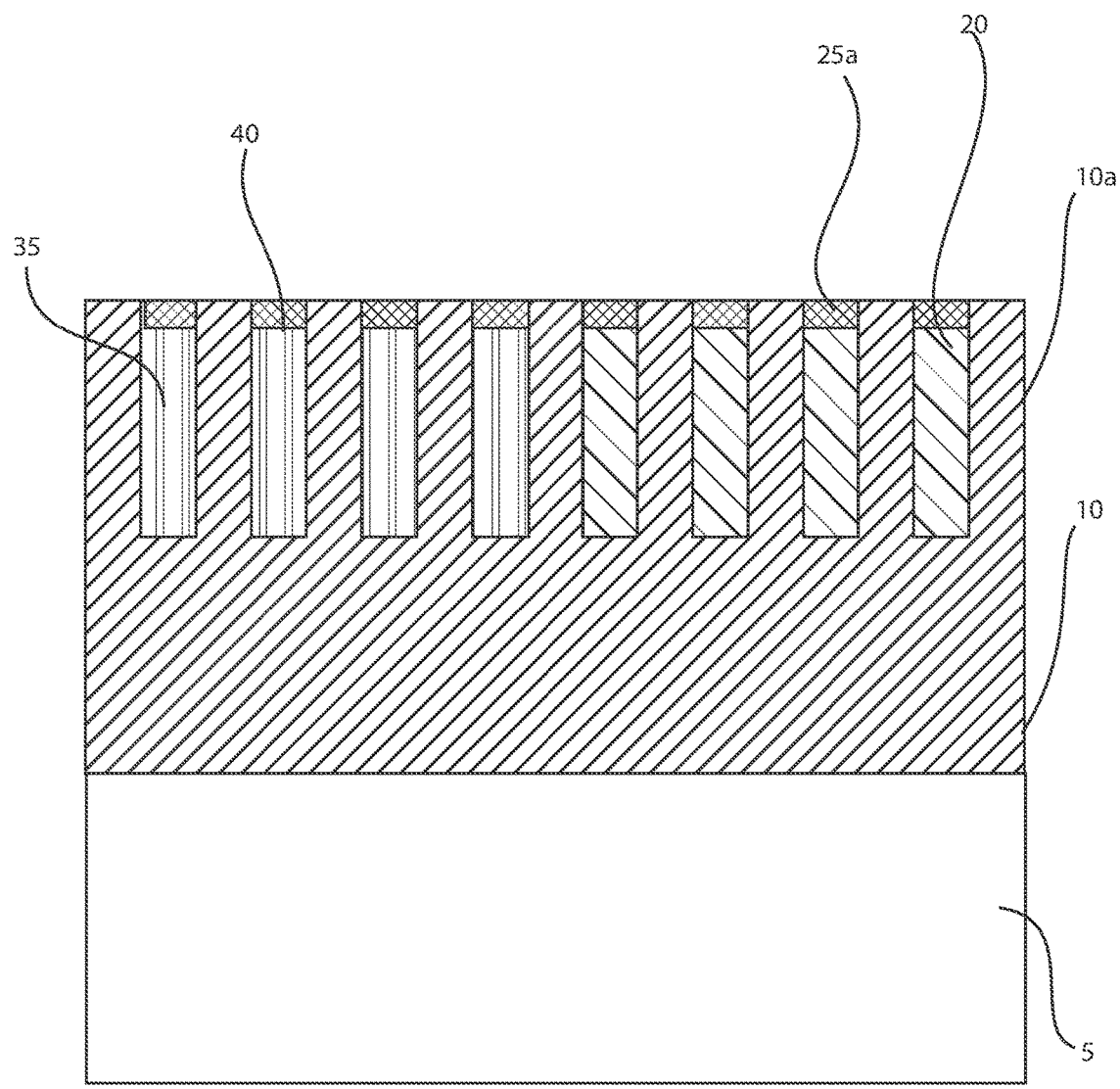
FIG. 10 is a side cross-sectional view depicting one embodiment of forming a dielectric fin cap upon each of the second strained semiconductor material that provided the sidewalls of the fin trenches, in accordance with the present disclosure.

FIG. 10 depicts one embodiment of forming a dielectric fin cap 40 upon each portion of the second strained semiconductor material 35 that is present within the fin trenches. In some embodiments, forming the dielectric fin cap 40 may begin with removing the etch mask 30. The etch mask 30 may be removed by an etch that is selective to the first strained semiconductor material 20, the second strained semiconductor material 35 and the remaining portion of the at least partially relaxed semiconductor material 10a that provides the sidewalls of the fin trenches. The etch mask 30 may be removed by a wet chemical etch, or a dry etching process, such as reactive ion etching. Following removal of the etch mask 30, the upper surface of the second strained semiconductor material 35 may be planarized. For example, the upper surface of the second strained semiconductor material 35 may be planarized by chemical mechanical planarization (CMP) until the upper surface of the second strained semiconductor material 35 may be coplanar with the upper surface of the remaining portion of the at least partially relaxed semiconductor material 10a that provides the sidewalls of the fin trenches.

The upper surface of the second strained semiconductor material 35 may then be recessed relative to an upper surface of the remaining portion of the at least partially relaxed semiconductor material 10a and the first strained semiconductor material 20. The upper surface of the first strained semiconductor material 35 may be recessed with a etch that is selective to the first strained semiconductor material 20 and the remaining portion of the at least partially relaxed semiconductor material 10a that provides the sidewalls of the fin trenches. The etch process for recessing the second strained semiconductor material 35 may be an anisotropic etch or an isotropic etch. In one embodiment, the etch for recessing the second strained semiconductor material 35 may be a wet chemical etch. In another embodiment, the etch for recessing the second strained semiconductor material 35 may be reactive ion etch (RIE). The amount that the second strained semiconductor material 35 is recessed is the amount that is suitable for forming the dielectric fin cap 40. Following recessing of the second strained semiconductor material 35, a dielectric material is deposited on the recessed surface of the second strained semiconductor material 35 to form the dielectric fin cap 40. The dielectric material for forming the dielectric fin cap 40 may be an oxide, nitride, oxynitride, high-k dielectric, low-k dielectric, or any suitable combination of those materials. For example, the dielectric material for forming the dielectric fin cap 40 may be silicon oxide or silicon nitride. The dielectric material for forming the dielectric fin cap 40 may be deposited using a chemical vapor deposition (CVD) process, such as plasma enhanced chemical vapor deposition (PECVD), metal organic chemical vapor deposition (MOCVD), high density plasma chemical vapor deposition (HDPCVD) or a combination thereof. The dielectric material for forming the dielectric fin cap 40 may also be formed using a thermal growth method, such as thermal oxidation. Following deposition, the dielectric material may be planarized so that an upper surface of the remaining portion of the dielectric material for the dielectric fin cap 40 may be coplanar with a remaining portion of the at least partially relaxed semiconductor material 10a that provides the sidewall of the fin trenches and the first strained semiconductor material 20 that is present in the fin trenches, as depicted in FIG. 10.

Figure 11:
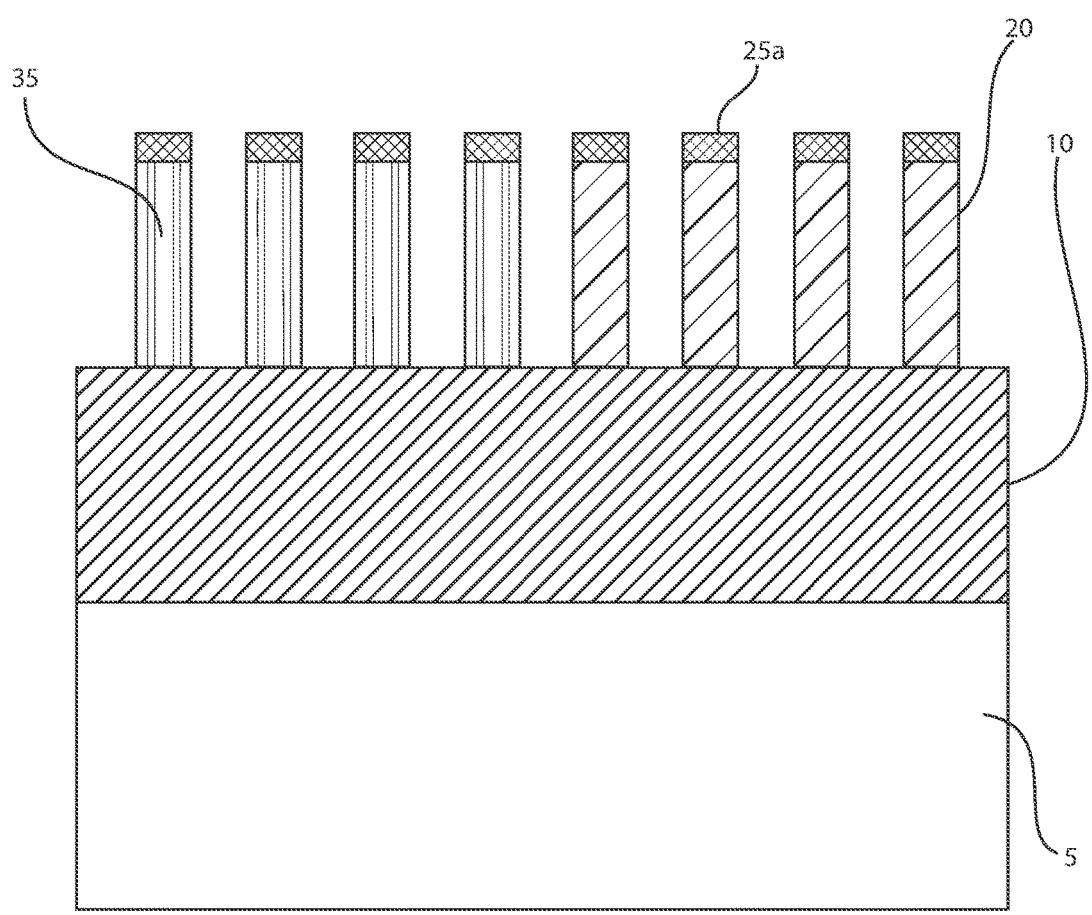
FIG. 11 is a side cross-sectional view depicting one embodiment of removing the remaining portion of the at least partially relaxed semiconductor material, in accordance with the present disclosure.

FIG. 11 depicts one embodiment of removing the remaining portion of the at least partially relaxed semiconductor material 10a that provides the sidewalls of the fin trenches. In some embodiments, removing the remaining portion of the at least partially relaxed semiconductor material 10a that provides the sidewalls of the fin trenches includes an etch process that is selective to the dielectric fin caps 25a, 40. In some examples, the etch process for removing the remaining portion of the at least partially relaxed semiconductor material 10a is also selective to the first strained semiconductor material 20 and the second strained semiconductor material 35. In one example, the etch process for removing the remaining portion of the at least partially relaxed semiconductor material 10a includes a wet chemical etch. In another example, the etch process for removing the remaining portion of the at least partially relaxed semiconductor material 10a that provides the sidewalls of the fin trenches includes an anisotropic etch, such as reactive ion etch.

Removing the remaining portion of the at least partially relaxed semiconductor material 10a that provides the sidewalls of the fin trenches exposes the fin structures, which are provided by the first strained semiconductor material 20 and the second strained semiconductor material 35. The side cross-sectional view that is depicted in FIG. 11 is along a plane that is perpendicular to the length of the fin structure separating the subsequently formed source and drain regions of the FinFETs.

Figure 12:
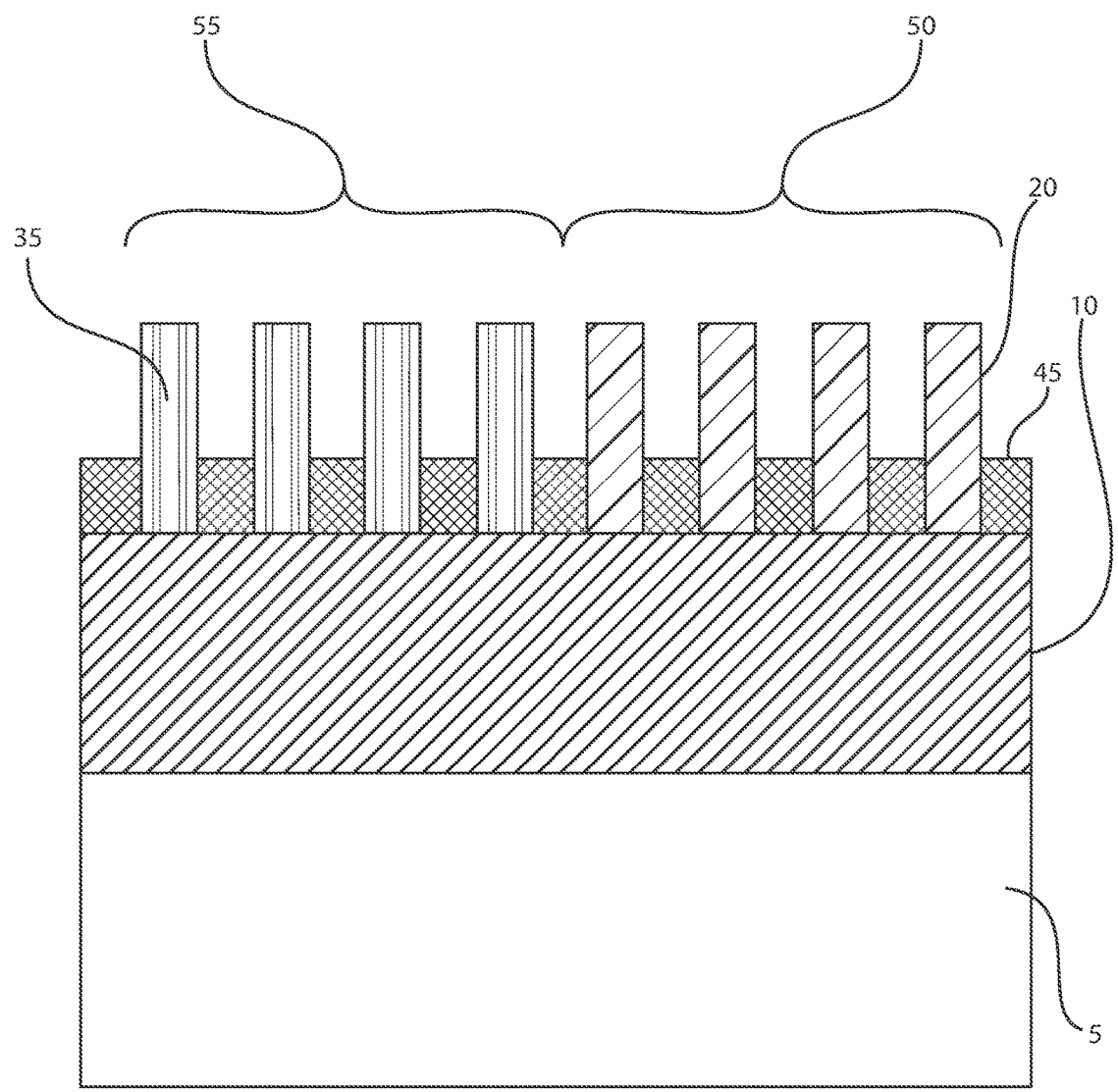
FIG. 12 is a side cross-sectional view depicting forming isolation regions between the fin structures of the first strained semiconductor material and the second strained semiconductor material, in accordance with one embodiment of the present disclosure.

FIG. 12 depicts one embodiment of forming isolation regions 45 between the fin structures of the first strained semiconductor material 20 and the second strained semiconductor material 35. In some embodiments, the dielectric fin caps 25a, 40 may be removed prior to forming the isolation regions 45. The dielectric fin caps 25a, 40 may be removed using a selective etch process, such as wet chemical etching and/or reactive ion etching. The isolation regions 45 may be composed of any dielectric material, such as an oxide, nitride, oxynitride, high-k dielectric, low-k dielectric, or any suitable combination of those materials. For example, when the isolation regions 45 are composed of an oxide, the isolation regions 45 may be composed of silicon oxide. In another example, when the isolation regions 45 are composed of a nitride, the isolation regions 45 may be composed of silicon nitride. The isolation regions 45 may be deposited using a chemical vapor deposition (CVD) process, such as plasma enhanced chemical vapor deposition (PECVD), metal organic chemical vapor deposition (MOCVD), high density plasma chemical vapor deposition (HDPCVD) or a combination thereof. The isolation regions 45 may also be formed using a thermal growth method, such as thermal oxidation. To ensure that the isolation region 45 are present only at the base of the fin structures, a recess etch may be employed in combination with the aforementioned deposition processed for forming the isolation regions 45.

The fin structures provided by the first strained semiconductor material 20 and the second strained semiconductor material 35 may be used to form Fin Field Effect Transistors (FinFETs). In some embodiments, a first plurality 50 of fin structures composed of the first strained semiconductor material 20 of germanium (Ge) are processed to provide p-type FinFETs, and a second plurality 55 of fin structures composed of the second strained semiconductor material 35 of silicon (Si) are processed to provide n-type FinFETS. The term conductivity type refers to whether a structure has an n-type conductivity or p-type conductivity.

The compressive strain that is typically provided by fin structures of the first strained semiconductor material 20, e.g., germanium (Ge) fin structure formed on at least partially relaxed silicon germanium (SiGe) material, produce increased hole carrier mobility, which provides a performance enhancement for p-type conductivity FinFETs. The compressive strain produced within the first strained semiconductor material 20 may range from 200 MPa to 3 GPa.

The tensile strain that is typically provided by fin structures of the second strained semiconductor material 35, e.g., silicon (Si) fin structure formed on at least partially relaxed silicon germanium (SiGe) material, produce increased electron carrier mobility, which provides a performance enhancement for n-type conductivity FinFETs. The tensile strain produced within the second strained semiconductor material 35 may range from 200 MPa to 3 GPa.

Typically, forming FinFET devices from the fin structures depicted in FIG. 12 include forming a gate structure 60 on the channel region portion of the fin structures, and forming source and drain regions 65 on the opposing sides of the channel region portion of the fin structures, as depicted in FIG. 13. The gate structure 60 typically functions to apply an electric field to the semiconductor device to switch the device between "ON" and "OFF" states, and may also be referred to as a functional gate structure. The gate structure 60 typically includes at least one gate dielectric 61 that is present on the channel region of the fin structures, and at least one gate conductor 62 that is present on the at least one gate dielectric 61. A gate sidewall spacer 63 may be present on the sidewall of the gate structure 60. As used herein, the term "drain" means a doped region in semiconductor device located at the end of the channel region of the fin structure, in which carriers are flowing out of the transistor, e.g., FinFET, through the drain. The term "source" is a doped region in the semiconductor device, e.g., FinFET, in which majority carriers are flowing into the channel region. The channel region is the region underlying the gate structure and between the source and drain of a semiconductor device that becomes conductive when the semiconductor device is turned on. One embodiment for forming the gate structure and source and drain regions is now described in greater detail. It is noted that the following process steps for producing the FinFETs in the are provided for illustrative purposes and are not intended to limit the disclosure, as additional and intermediate processing steps that are not discussed herein are contemplated and are within the scope of the disclosure.

In one example, the gate structure 60 may be formed contacting the channel region portion of the fin structures provided by the first strained semiconductor material 20 and the second strained semiconductor material 35. In one example, the gate dielectric 61 of the gate structure 60 may be formed by a thermal growth process such as, e.g., oxidation, nitridation or oxynitridation; or the gate dielectric 61 may be formed by a deposition process such as, e.g., CVD, plasma-assisted CVD, MOCVD, ALD, evaporation, reactive sputtering, chemical solution deposition and other like deposition processes. The gate dielectric 61 may also be formed utilizing any combination of the above processes.

The gate dielectric 61 may be comprised of an insulating material having a dielectric constant of about 4.0 or greater. In another embodiment, the gate dielectric 61 is comprised of an insulating material having a dielectric constant greater than 7.0. The dielectric constants mentioned herein are relative to a vacuum. In one embodiment, the gate dielectric 61 employed in the present disclosure includes, but is not limited to, an oxide, nitride, oxynitride and/or silicates including metal silicates, aluminates, titanates and nitrides. In one example, when the gate dielectric 61 is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the gate dielectric 61 may vary, but typically, the gate dielectric 61 has a thickness from 1 nm to 10 nm. In another embodiment, the gate dielectric 61 has a thickness from 1 nm to 3 nm.

After forming the material layer for the gate dielectric 61, a blanket layer of a conductive material which forms the gate conductor 62 of gate structure 60 is formed on the gate dielectric 61 utilizing a deposition process, such as physical vapor deposition (PVD), CVD or evaporation. The conductive material may comprise polysilicon, SiGe, a silicide, a metal or a metal-silicon-nitride such as Ta—Si—N. Examples of metals that can be used as the conductive material include, but are not limited to, Al, W, Cu, and Ti or other like conductive metals. The blanket layer of conductive material may be doped or undoped. If doped, an in-situ doping deposition process may be employed. Alternatively, a doped conductive material can be formed by deposition, ion implantation and annealing.

In some embodiments, the gate structure 60 further includes a gate dielectric cap 64. The gate dielectric cap 64 may be a nitride, oxide or oxynitride material. In one embodiment, when the gate dielectric cap 64 is an oxide, the gate dielectric cap 64 may be composed of silicon oxide (SiO2). In one embodiment, when the gate dielectric cap 64 is a nitride, the gate dielectric cap 64 may be composed of silicon nitride (SiN).

After deposition of at least the material layers for the gate dielectric 61, the gate conductor 62 and the gate dielectric cap 64, the gate structure 60 is patterned and etched using photolithography and etch processes. In one embodiment, the gate structures 60 are formed by first providing a patterned mask atop the conductive material by deposition and lithography and then transferring the pattern to the conductive material for the gate conductor 62 and the gate dielectric 61. The etching steps may comprise one or more etching processes including dry etching, such as reactive ion etch (RIE).

At least one dielectric gate spacer 63 may then be formed on the sidewall of the gate structure 60. In one embodiment, the dielectric gate spacer 63 may be formed by using a blanket layer deposition, such as CVD, and an anisotropic etchback method. The dielectric gate spacer 63 may have a width ranging from 2.0 nm to 15.0 nm, and may be composed of a dielectric, such as a nitride, oxide, oxynitride, or a combination thereof.

Source and drain regions 65 may be provided on opposing sides of the channel region portion of the fin structures provided by the first strained semiconductor material 20 and the second strained semiconductor material 35. For example, the source and drain regions 65 may be formed by in situ doped epitaxial semiconductor material on the fin structures on the opposing sides of the channel region portion of the fin structures. The term "in situ" denotes that the dopant is added to the material as it is being formed, e.g., during the epitaxial deposition process. Typically, the conductivity type of the dopant for the source and drain regions 65 dictates the conductivity type of the semiconductor device, e.g., whether the FinFETs being formed are n-type FinFETs or p-type FinFETs.

P-type conductivity source and drain regions 65 are produced in type IV semiconductors, such as silicon, germanium and silicon germanium, by doping the semiconductor material with group III-A elements of the Periodic Table of Elements, such as boron. N-type conductivity source and drain regions 65 are produced in the type IV semiconductors, such as silicon or germanium, by doping the semiconductor material with group V elements, such as P or As. In some embodiments, dopant from the in-situ doped n-type or p-type semiconductor may be diffused into the underlying portions of the fin structures to provide source and drain extension regions.

The above method for forming the gate structure 60 and the source and drain regions 65 may be referred to as a gate first process sequence for forming a semiconductor device. The present disclosure is not limited to only this embodiment, as the gate structure 60 and the source and drain regions may also be formed using a gate last process sequence, which may also be referred to as a replacement gate process. In a gate last process sequence, a sacrificial gate structure is first formed on the channel region portion of the fin structures, wherein the sacrificial gate structure provides the geometry of the later formed functional gate structure. Following formation of the sacrificial gate structure, the source and drain regions 65 are formed. After forming the source and drain regions 65, the sacrificial gate structure is replaced with a functional gate structure 50, wherein the functional gate structure functions to switch the semiconductor device from the "ON" and "OFF" states. Both gate first and gate last process sequences are applicable to the present disclosure.

FIG. 13 depicts one embodiment of an electrical device 100 that may be formed using the method described above with reference to FIGS. 1-12. In some embodiments, the electrical device 100 may include a partially relaxed substrate 10, a first plurality of FinFETs on a first portion of the partially relaxed substrate 10, and a second plurality of FinFETs on a second portion of the partially relaxed substrate 10. The first plurality of FinFETs includes first fin structures of a first base material, i.e., first strained semiconductor material 20, that is unalloyed strained silicon (Si), and first source and drain regions 65 of a first conductivity type, e.g., n-type conductivity. The second plurality of FinFETs includes second fin structures of a second base material, i.e., second strained semiconductor material 35, that is unalloyed strained germanium (Ge), and second source and drain regions 65 of a second conductivity type, e.g., p-type. The first plurality of FinFETs including the compressively strained germanium (Ge) fin structures are present on the same at least partially relaxed silicon germanium (SiGe) substrate as the second plurality of FinFETs including the tensile strained silicon (Si) fin structures. The first base material that provides the fin structures for the first plurality of fin structures may be 100 at. % germanium, and the second base material that provides the fin structures for the second plurality of fin structures may be 100 at. % silicon. The tensile strain within the tensile strained silicon (Si) fin structures may be between 1% and 2%. The compressive strain within the compressive strained germanium (Ge) fin structures may be between 1% and 2%. Although FIG. 13 only depicts a single FinFET including a fin structure of unalloyed silicon, and a single FinFET including a fin structure of unalloyed germanium for the purposes of simplicity, any number of FinFETs each including a fin structure composed of one of the first or second strained semiconductor material 20, 35 may be present on the relaxed semiconductor substrate 10.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor device comprising:
   forming a plurality of trenches in a semiconductor material;
   filling at least a portion of the plurality of trenches with a strained semiconductor material; and
   removing a remaining portion of the semiconductor material that provides sidewalls of the trenches to provide a plurality of fin structures of the strained semiconductor material.

2. The method of claim 1, wherein the semiconductor material is silicon germanium (SiGe) that is epitaxially formed on a substrate of silicon (Si).

3. The method of claim 2, wherein the semiconductor material is a layered structure of silicon germanium, wherein a germanium concentration of layered structure increases with substantially each layer of the layered structure from an interface with the substrate of silicon (Si).

4. The method of claim 2, wherein the semiconductor material is formed using a condensation method.

5. The method of claim 2, wherein the semiconductor material is 90% relaxed in either a compressive strain or tensile strain direction.

6. The method of claim 1, wherein said forming the plurality of the trenches in the semiconductor material comprises a reverse sidewall image transfer (SIT) etch process.

7. The method of claim 1, wherein a pitch between adjacent fin structures in the plurality of fin structures is at least twice a width of a fin structure in the plurality of fin structures.

8. The method of claim 1, wherein the filling of said at least the portion of the plurality of trenches with the strained semiconductor material formed using the epitaxial deposition comprises filling said at least the portion of the plurality of the fin trenches with one of silicon (Si) or germanium (Ge).

9. The method of claim 1, wherein the removing a remaining portion of the at semiconductor material to provide the plurality of fin structure of the strained semiconductor material comprises forming a dielectric cap on the strained semiconductor material, and etching the remaining portion of the semiconductor that provides the sidewalls of the fin trenches.

10. A method of forming a semiconductor device comprising:
    forming a plurality of trenches in a semiconductor material;
    forming a first strained semiconductor material in a first portion of the plurality of fin trenches, and a second strained semiconductor material in a second portion of the plurality of the fin trenches, wherein the first strained semiconductor material produces a different strain than the second strained semiconductor material; and
    removing a remaining portion of the semiconductor material that provides sidewalls of the fin trenches to provide a first plurality of fin structures of the first strained semiconductor material and a second plurality of fin structures of the second strained semiconductor material.

11. The method of claim 10, wherein the semiconductor material is silicon germanium (SiGe) that is epitaxially formed on a substrate of silicon (Si).

12. The method of claim 11, wherein the semiconductor material is 90% relaxed in either a compressive strain or tensile strain direction.

13. The method of claim 11, wherein the forming of the first strained semiconductor material in the first portion of the plurality of the fin trenches comprises:
    filling the plurality of the fin trenches with the first strained semiconductor material, wherein the first strained semiconductor material is germanium;
    recessing the first strained semiconductor material;
    forming a first dielectric cap on the first strained semiconductor material;
    forming an etch mask over the first portion of the plurality of the fin trenches, wherein the second portion of the plurality of the fin trenches is exposed; and
    removing the first strained semiconductor material and the first dielectric cap from the second portion of the plurality of the fin trenches that is exposed.

14. The method of claim 13, wherein the forming of the second strained semiconductor material in the second portion of the plurality of the fin trenches comprises filling the second portion of the plurality of the fin trenches that is exposed with the second strained semiconductor material, wherein the second strained semiconductor material is silicon.

15. The method of claim 14, wherein the removing of the remaining portion of the semiconductor material to provide the plurality of fin structure of the first strained semiconductor material comprises forming a second dielectric cap on the second strained semiconductor material; and etching the remaining portion of the semiconductor selectively to at least the first dielectric cap and the second dielectric cap.

16. The method of claim 15 further comprising removing the first and second dielectric cap and forming an isolation region between adjacent fin structures of the first and second strained semiconductor material.

17. The method of claim 10 further comprising forming a gate structure on a channel portion of the first plurality of fin structures of the first strained semiconductor material and the second plurality of fin structures of the second strained semiconductor material, and forming source and drain regions on opposing sides of the channel portion the first plurality of fin structures of the first strained semiconductor material and the second plurality of fin structures of the second strained semiconductor material.

18. An electrical device comprising:
a first plurality of FinFETs on a first portion of a substrate, wherein the first plurality of FinFETs includes first fin structures of a first base material that is unalloyed strained first semiconductor material; and
a second plurality of FinFETs on a second portion of the substrate, wherein the second plurality of FinFETs includes second fin structures of a second base material that is unalloyed strained second semiconductor material, wherein the first base material and the second base material are both present on a substrate of a single composition partially relaxed material that is a different composition from the first base material and the second base material.

19. The electrical device of claim 18, wherein the first base material is 100 at. % germanium, and the second base material is 100 at. % silicon.

20. The electrical device of claim 19 further comprising first source and drain regions to the first plurality of FinFETs having a first conductivity type and second source and drain regions to a second plurality of FinFETs having a second conductivity type, wherein the first conductivity type is p-type and the second conductivity type is n-type.

* * * * *